(12) United States Patent
Montanyá Puig et al.

(10) Patent No.: US 11,243,238 B2
(45) Date of Patent: Feb. 8, 2022

(54) METHOD FOR WARNING ABOUT LIGHTNING ACTIVITY IN WIND FARMS

(71) Applicant: Siemens Gamesa Renewable Energy Innovation & Technology S.L., Sarriguren (ES)

(72) Inventors: Joan Montanyá Puig, Castellnou de Bages (ES); Gloria Solà de las Fuentes, Castellnou de Bages (ES); Oscar A. Van der Velde, Castellgali (ES); Victor March Nomen, Les Fonts (ES)

(73) Assignee: SIEMENS GAMESA RENEWABLE ENERGY INNOVATION & TECHNOLOGY S.L.

( * ) Notice: Subject to any disclaimer, the term of this patent is extended or adjusted under 35 U.S.C. 154(b) by 0 days.

(21) Appl. No.: 16/769,037

(22) PCT Filed: Dec. 4, 2018

(86) PCT No.: PCT/EP2018/083426
§ 371 (c)(1),
(2) Date: Jun. 2, 2020

(87) PCT Pub. No.: WO2019/115282
PCT Pub. Date: Jun. 20, 2019

(65) Prior Publication Data
US 2021/0231721 A1     Jul. 29, 2021

(30) Foreign Application Priority Data
Dec. 14, 2017   (ES) .................................. P201700795

(51) Int. Cl.
*G01R 29/08*     (2006.01)
*G01W 1/10*     (2006.01)
(Continued)

(52) U.S. Cl.
CPC ........... *G01R 29/0842* (2013.01); *G01W 1/10* (2013.01); *G01W 1/16* (2013.01); *F03D 80/30* (2016.05)

(58) Field of Classification Search
CPC ....... G01R 29/0842; G01W 1/10; G01W 1/16
See application file for complete search history.

(56) References Cited

U.S. PATENT DOCUMENTS

2007/0156339 A1    7/2007   Oettinger
2016/0291204 A1*   10/2016   Groenhagen ........... G01W 1/16

FOREIGN PATENT DOCUMENTS

CN     105068149 A     11/2015
CN     105745804 A     7/2016
(Continued)

OTHER PUBLICATIONS

Victor March "Key issues to define a method of lightning risk assessment for wind farms"; Electric Power Systems Research vol. 159, Jun. 2018, pp. 50-57; Electrical Unit, Technology Department, Gamesa Innovation & Technology, Pamplona, Spain.
(Continued)

*Primary Examiner* — Curtis B Odom
(74) *Attorney, Agent, or Firm* — Schmeiser, Olsen & Watts LLP

(57) ABSTRACT

A method for warning about lightning activity in wind farms which is suitable for predicting the generation of upward lightning originating from the wind-driven power generators the wind farm and for warning about the possible generation is provided. To that end, in the method the presence or absence of a storm cell in the wind farm and/or in the vicinity thereof, within a radius of less than 400 km, is detected; the local electric field in the wind farm is measured, at least one atmospheric condition is identified or measured under given premises, and the probabilities of the generation of upward lightning originating from the wind- (Continued)

driven power generators of the wind farm are determined depending on the result of the measurements, identifications and detections, a warning signal being transmitted in the event that the determined probability exceeds a given threshold value.

12 Claims, 3 Drawing Sheets

(51) Int. Cl.
  *G01W 1/16*   (2006.01)
  *F03D 80/30*   (2016.01)

(56) References Cited

FOREIGN PATENT DOCUMENTS

| | | |
|---|---|---|
| CN | 106353605 A | 1/2017 |
| CN | 106443212 A | 2/2017 |
| ES | 2492565 T3 | 9/2014 |
| JP | S59108980 A | 6/1984 |
| KR | 101295617 B1 | 8/2013 |

OTHER PUBLICATIONS

Vestas-chooses-weather-decision-technologies-lightning-decision-support-system-for-wind-energy-farms; Dec. 14, 2009.
Joan Montanyà et al.: "Global distribution of winter lightning: a threat to wind turbines and aircraft"; Nat. Hazards Earth Syst. Sci., 16, 1465-1472, 2016; www.nat-hazards-earth-syst-sci.net/16/1465/2016/ doi:10.5194/nhess-16-1465-2016.
Farouk A.M. Rizk: "Modeling of Lightning Incidence to Tall Structures Part I: Theory"; IEEE Transactions on Power Delivery, vol. 9, No. 1, Jan. 1994, Jan. 31, 1994.
J. Montanyà et al. Total Lightning, Electrostatic Field and Meteorological Radar Applied To Lightning Hazard Warning. 20th International Lighning Detection Conference, Dec. 31, 2008.
International Search Report and Written Opinion dated Feb. 29, 2019 for PCT/EP2018/083426.
Fujii, Fumiyuki et al: "Characteristics of Winter Lightning Threatening Wind Turbines in Coastal Area of the Sea of Japan"; Electrical Engineering in Japan; vol. 184; No. 2; pp. 973-978; 2013.
Ishii, Masaru: "Probability of Lightning Hits to Tall Structures Taking Account of Upward Lightning"; 2010 Asia Pacific International Symposium on Electromagnetic Compatibility; 2010.
Chinese Office Action dated Jul. 14, 2021 for Application No. 201880080242.2.

* cited by examiner

METHOD FOR WARNING ABOUT LIGHTNING ACTIVITY IN WIND FARMS

CROSS-REFERENCE TO RELATED APPLICATIONS

This application claims priority to PCT Application No. PCT/EP2018/083426, having a filing date of Dec. 4, 2018, which is based on ES Application No. P201700795, having a filing date of Dec. 14, 2017, the entire contents both of which are hereby incorporated by reference.

FIELD OF TECHNOLOGY

The following relates to methods for warning about lightning activity in wind farms, and more specifically about upward lightning activity.

BACKGROUND

Wind-driven power generators are exposed to lightning strikes due to their height and location. There are two types of lightning strikes: downward lightning strikes and upward lightning strikes (upward lightnings). Downward lightning strikes are the most common, but upward lightning strikes often occur in tall structures. Upward lightning strike activity is known to be greater than 30% in structures over 150 meters high. This percentage increases in tall structures located on mountain tops or in places where the phenomenon known as "thundersnow" takes place. The "thundersnow" phenomenon consists of winter storms characterized by storm clouds with a low charge and with the center of the negative charge being at lower heights (1 to 3 km compared to 6 to 9 km for the summer or convective storms).

Storm warning systems that aim to detect summer storms (relating to high downward lightning activity) are known, such as the one disclosed in US20160291204A1, for example, which is based on magnetic field meters and/or electromagnetic sensors.

International standards cover storm warning systems, such as IEC 62793:2016, for example. Again, this standard describes practices and systems for detecting convective storms (summer storms), but not winter storms in which upward lightning activity can make up 100% of all lightning events. In some wind farms, more than ten upward events occur in a wind-driven power generator during a single winter storm.

Winter storms are hard to detect because all upward events originate from tall structures (wind-driven power generators), and there is no downward lightning activity. In other words, there is no prior lightning activity before upward lightnings originate from the wind-driven power generators.

SUMMARY

An aspect relates to a method for warning about lightning activity in wind farms, as defined in the claims.

The method is suitable for predicting the generation of upward lightnings in wind farms, where upward lightnings are the lightnings that are generated in the actual wind-driven power generators and not in the clouds, and for warning about the possible generation.

To that end, in the method the presence or absence of a storm cell in the wind farm and/or in the vicinity thereof, within a radius of less than 400 km, is detected, the local electric field is measured, at least one atmospheric condition is identified or measured under given premises, and the probabilities of the generation of upward lightnings originating from the wind-driven power generators of the wind farm are determined depending on the result of the measurements, identifications and detections, a warning signal being transmitted in the event that the determined probability exceeds a given threshold value.

Determining the presence of a storm cell in a given location is already known. In the method the presence in the wind farm or in the vicinity (within a radius of less than 400 km) is detected, and to reinforce and assure the presence of a storm in the actual wind farm, the presence of a storm in the wind farm is furthermore determined depending on the local electric field present in the wind farm. However, with these determinations it is not possible to determine the risk of upward lightnings occurring, so the method takes other added factors into account.

It has surprisingly been found that if a given relationship between different atmospheric conditions (or between an atmospheric condition and a given premise linked to another atmospheric condition), combined with the detection of the presence of a storm by means of the electric field and the detection of a storm cell, is satisfied, a winter storm, and therefore a risk of the generation of upward lightnings, can be successfully forecast or anticipated. For this reason, the identification or measurement of at least one atmospheric condition are furthermore added to the previously considered factors.

As it has been found that satisfying a given relationship between different atmospheric conditions (or an atmospheric condition and a given premise linked to another atmospheric condition), combined with the detection of the presence of a storm by means of the electric field and the detection of a storm cell, is enough to detect a risk of the generation of upward lightnings, measuring just one atmospheric condition under the atmospheric conditions or given premises of at least one other atmospheric condition is enough to successfully predict or anticipate a winter storm. So, for example, by using an atmospheric pressure value as a given atmospheric condition (or height with respect to sea level as a given premise linked to another atmospheric condition) as a reference, the temperature existing at the pressure (or at the height) can be measured or identified, where it is determined that a risk exists if a given relationship is satisfied.

Depending on the location of the wind farm, the value of the atmospheric conditions, under the given premises, may vary, as may the conditions (the value of those conditions to be considered), i.e., the relationship between the atmospheric condition and the given conditions may vary from one location to another. Therefore, by establishing the suitable relationship corresponding to the location of the wind farm, the method allows knowing the risk of upward lightnings being generated in the wind farm, and this detection has not been disclosed in the conventional art.

Therefore, the probabilities of the generation of upward lightnings originating from the wind-driven power generators of the wind farm are determined with the method depending on the result of the aforementioned measurements, identifications and detections, and a warning signal announcing this fact is transmitted in the event that the determined probability exceeds a given threshold value. The warning signal can be sent wherever required in order to act as deemed necessary.

BRIEF DESCRIPTION

Some of the embodiments will be described in detail, with reference to the following figures, wherein like designations denote like members, wherein.

DETAILED DESCRIPTION

Figure 1:
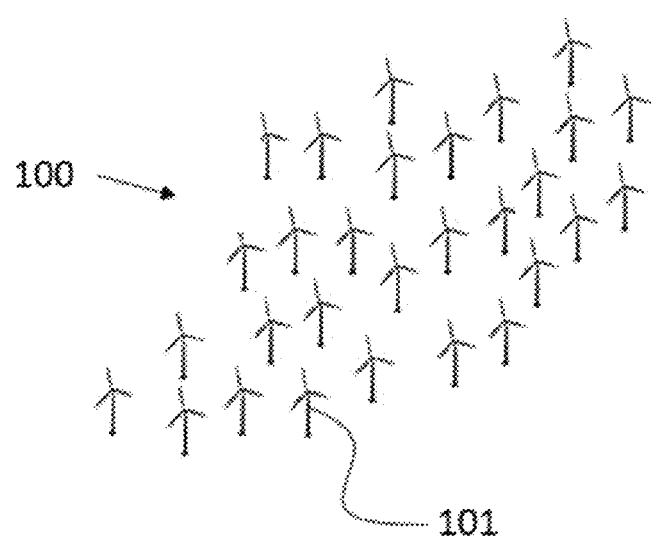
FIG. 1 shows a wind farm.

The method is suitable for predicting the generation of upward lightnings in a wind farm 100 like the one shown in FIG. 1 by way of example, where the lightnings are the lightnings that are generated in the actual wind-driven power generators 101 of the wind farm 100 and not in the clouds, and for warning about the possible generation.

Figure 2:
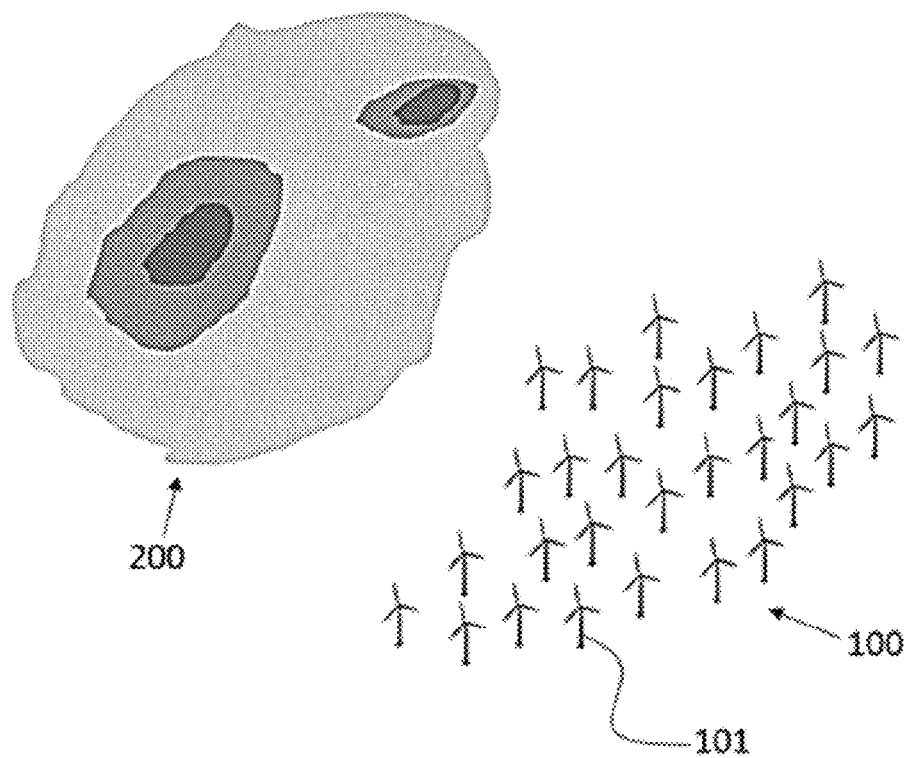
FIG. 2 shows a storm cell in the vicinity of the wind farm.

To that end, in the method the presence or absence of a storm cell 200 in the wind farm 100 and/or in the vicinity thereof (cell 200 depicted in FIG. 2 by way of example) is detected. The detection is carried out in the actual wind farm 100, or within a radius of less than 400 km, because if such detection is performed in a geographical area located farther away, the possibility of the cell 200 not affecting the wind farm 100 considerably increases. The detection of the presence or absence of a storm cell 200 in the wind farm 100 and/or in the vicinity thereof is performed, in an already known manner, by at least one of radar and satellite.

Figure 3:
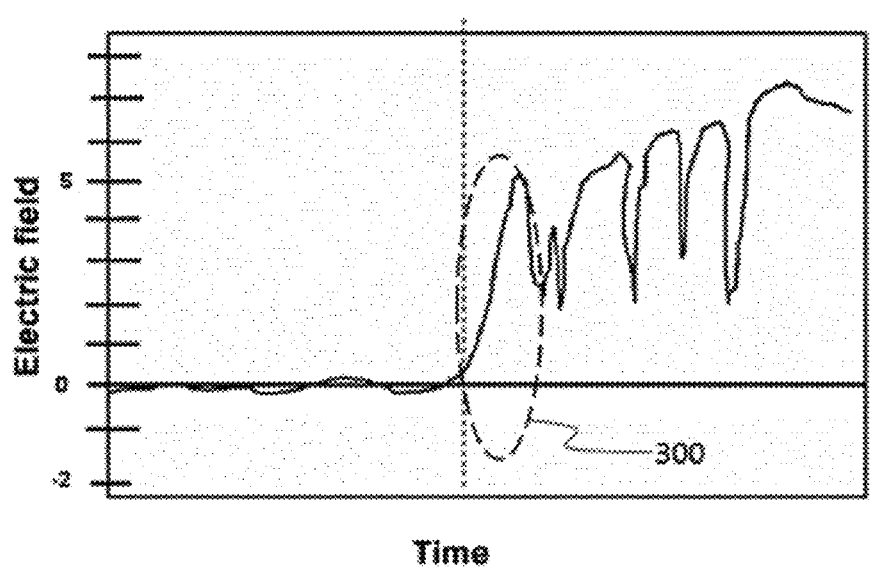
FIG. 3 shows the development of the local electric field in a wind farm, whereby the presence of a storm is determined.

Furthermore, in the method the local electric field in the wind farm 100, which is a common way to detect a summer storm, is measured. The presence of a storm in the wind farm 100 can therefore be reinforced and assured with this measurement. In particular, and as is already known, if the electric field in the measurement area is positive with respect to a predetermined threshold value, the threshold value corresponding to the value of the electric field in good weather conditions, or if it suddenly changes with respect to the predetermined threshold value, as shown in the example of FIG. 3, the presence of a storm in the location where the measurement of the electric field has been performed is determined. The value of the local electric field in good weather conditions is conventionally close to −100 V/m. The predetermined threshold value is therefore close to −100 V/m, the value being previously established with prior measurements and/or experiences. In the example of FIG. 3, for example, the presence of a storm can be identified in area 300 (sudden change).

However, the presence or the risk of the presence of a storm in the wind farm 100 would be reinforced with this additional factor, but it would not be enough to enable determining the risk of upward lightnings occurring (it is not enough to determine that the storm is a winter storm).

As discussed above, it has been found that if a given relationship between different atmospheric conditions (or an atmospheric condition and a given premise linked to another atmospheric condition), combined with the detection of the presence of a storm by means of the electric field and the detection of a storm cell 200, is satisfied, a winter storm, and therefore a risk of the generation of upward lightnings, can be successfully forecast or anticipated. For this reason, the identification or measurement of at least one atmospheric condition are furthermore added to the previously considered factors.

As has also been discussed, measuring just one atmospheric condition under the given conditions or premises of at least one other atmospheric condition is enough. So, for example, by using an atmospheric pressure value as a given atmospheric condition (or height with respect to sea level as a given premise linked to another atmospheric condition) as a reference, the temperature existing at the pressure (or at the height) can be measured or identified, where it is determined that a risk exists if a given relationship is satisfied.

Depending on the location of the wind farm 100, the value of the atmospheric conditions, under the given premises, may vary, as may the conditions (the value of those conditions to be considered), i.e., the relationship between the atmospheric condition and the given conditions may vary from one site to another. Therefore, by establishing the suitable relationship corresponding to the location of the wind farm 100, the method allows knowing the risk of upward lightnings being generated in the wind farm 100, and the conventional art is not able to perform this detection.

Therefore, the probabilities of the generation of upward lightnings originating from the wind-driven power generators of the wind farm 100 are determined with the method depending on the result of the aforementioned measurements, identifications and detections, and a warning signal announcing this fact is transmitted in the event that the determined probability exceeds a given threshold value. The warning signal can be sent wherever required in order to act as deemed necessary.

In summary, it is determined that the determined probability exceeds the given threshold value and a warning signal is sent if the presence of a storm cell 200 is detected (see FIG. 2), a sudden growth of the local electric field or a positive local electric field with respect to the predetermined threshold value is detected (see FIG. 3), and it is detected that the relationship between the atmospheric condition and the given premises comply with predetermined requirements.

The atmospheric condition to be taken into account is the temperature, which is measured or identified, and the predetermined premise is a given pressure and/or a given height with respect to the sea. So, the requirements that have to be satisfied in order for the probabilities to exceed the given threshold correspond to a given temperature at a given pressure and/or height.

The temperature is identified or measured by one criterion or several criteria selected from radio sounding performed in the vicinity of the wind farm 100, within a radius of less than 400 km, reanalysis data, IRA-interim data, and estimation of the temperature, under the given conditions, based on an estimation performed using the measured ground temperature of the wind farm 100.

It has been found that in the presence of a storm and a storm cell 200, if the temperature is less than −10° C. at a pressure of 700 hPa and/or at a height of about 3 km with respect to sea level, there is a high risk of upward lightnings being generated. This relationship can thereby be predetermined as a requirement to be satisfied by the relationship between the atmospheric condition (temperature in this case) and the given premises (pressure and/or height with respect to sea level): a temperature less than −10° C. at a pressure of 700 hPa and/or at a height of about 3 km with respect to sea level.

However, as has also been discussed above, these requirements may vary depending on the location of the wind farm 100, so the method allows adjusting or adapting these requirements as needed.

In some embodiments of the method, the severity of the upward lightnings can furthermore be determined in the event that the risk of this upward lightnings being generated has been detected.

To that end, in the embodiments the speed and force of the wind in the wind farm 100 is identified, the height with respect to the sea at which the wind farm 100 is located is considered and/or the orography of the site where the wind farm 100 is located is considered, where greater severity is determined the greater the speed and the force of the wind, the higher the site where the wind farm 100 is located, and the less homogenous the orography of the site is.

The electric field measurements and the measurements taken by radar must be taken in the actual wind farm 100, since measurements of the actual conditions of the wind farm 100 are thereby obtained, unlike what occurs with radio sounding (for which there are various options, as discussed above).

The results of the measurements of the variables taken can be sent to remote equipment, for example, equipment which would be in charge of collecting the measurements and performing the necessary actions (such as an alarm algorithm, for example, to generate the warning signal).

The method can be implemented continuously and in real time, or it can be implemented in a discrete manner (at previously established time intervals), for example, to consume less energy.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for warning about lightning activity in a wind farm, wherein it is suitable for predicting the generation of upward lightnings originating from the wind-driven power generators of the wind farm and for warning about the possible generation, and to that end, the method comprising the steps of:
   at least one of the presence or absence of a storm cell in the wind farm and in a vicinity thereof, wherein the vicinity is within a radius of less than 400 km, is detected;
   a local electric field in the wind farm is measured;
   at least one atmospheric condition in the wind farm, or in the vicinity thereof, is identified or measured under given premises; and
   the probabilities of the generation of upward lightnings originating from the wind-driven power generators of the wind farm are determined depending on the result of the measurements, identifications and detections;
   a warning signal being transmitted in the event that the determined probability exceeds a given threshold value.

2. The method according to claim 1, wherein it is determined that the determined probability exceeds the given threshold value if
   a sudden growth of the local electric field or a positive local electric field with respect to a predetermined threshold value is detected, the threshold value corresponding to the value of the local electric field in good weather conditions;
   the presence of a storm cell is detected; and
   it is detected that the relationship between the atmospheric condition and the given premises satisfies given requirements.

3. The method according to claim 2, wherein the atmospheric condition that is measured or identified is a temperature, and the predetermined premise is considered at least one of a given pressure and a given height with respect to a sea level.

4. The method according to claim 3, wherein the relationship to be satisfied between the atmospheric condition and the given conditions for determining that the determined probability exceeds the given threshold value is at least one of a temperature less than $-10°$ C. at a pressure of 700 hPa, and at a height of about 3 km with respect to the sea level.

5. The method according to claim 3, wherein the atmospheric condition is identified or measured by one criterion or several criteria selected from
   radio sounding performed on the wind farm,
   radio sounding performed in the vicinity of the wind farm,
   reanalysis data, and
   estimation of the temperature, under the given conditions, based on an estimation performed using a measured ground temperature of the wind farm.

6. The method according to claim 2, wherein the relationship between the atmospheric condition and the given premises is adjustable or adaptable.

7. The method according to claim 1, wherein the detection of at least one of the presence or absence of a storm cell in the wind farm and in the vicinity thereof is performed by at least one of radar and satellite.

8. The method according to claim 1, wherein a speed and force of the wind in the wind farm, at least one of a height with respect to a sea level at which the wind farm is located and the orography of the site where the wind farm is located are identified to determine the severity of the upward lightnings in the event that the determined probability exceeds the given threshold value.

9. The method according to claim 8, wherein greater severity is determined the greater the speed and the force of the wind, the higher the site where the wind farm is located, and the less homogenous the orography of the site is.

10. The method according to claim 1, which is implemented continuously and in real time.

11. The method according to claim 1, which is implemented in a discrete manner at previously established time intervals.

12. The method according to claim 3, wherein the atmospheric condition is identified or measured by reanalysis data wherein the reanalysis data is IRA interim data.

* * * * *